United States Patent
Roehrig et al.

(10) Patent No.: US 10,956,440 B2
(45) Date of Patent: Mar. 23, 2021

(54) COMPRESSING A PLURALITY OF DOCUMENTS

(71) Applicant: INTERNATIONAL BUSINESS MACHINES CORPORATION, Armonk, NY (US)

(72) Inventors: Jochen Roehrig, Stuttgart (DE); Thomas H. Gnech, Herrenberg (DE); Steffen Koenig, Heidelberg (DE); Regina Illner, Nufringen (DE); Oliver Petrik, Stuttgart (DE); Christian Zoellin, Weinstadt (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 708 days.

(21) Appl. No.: 15/784,444

(22) Filed: Oct. 16, 2017

(65) Prior Publication Data
US 2019/0115934 A1    Apr. 18, 2019

(51) Int. Cl.
  *G06F 16/25*  (2019.01)
  *G06F 16/22*  (2019.01)

(52) U.S. Cl.
  CPC ........ *G06F 16/258* (2019.01); *G06F 16/2282* (2019.01)

(58) Field of Classification Search
  CPC .. G06F 40/126; G06F 40/146; G06F 16/1744; G06F 16/258
  See application file for complete search history.

(56) References Cited

U.S. PATENT DOCUMENTS

| | | | |
|---|---|---|---|
| 4,843,389 A | * | 6/1989 | Lisle .................. G06F 40/12 341/106 |
| 5,270,712 A | | 12/1993 | Iyer et al. |

(Continued)

FOREIGN PATENT DOCUMENTS

JP    2000269822    *    9/2000    .............. G06F 17/21

OTHER PUBLICATIONS

J-Plat-Pat Machine English Translation of JP 2000-269822 (Year: 2000).*

(Continued)

*Primary Examiner* — Amanda L Willis
(74) *Attorney, Agent, or Firm* — Noah Sharkan, Esq.; Kevin P. Radigan, Esq.; Heslin Rothenberg Farley & Mesiti P.C.

(57) ABSTRACT

Documents are compressed. A partially compressed document is obtained. The partially compressed document includes one or more code words that replace one or more common tokens of a document to be compressed. The one or more common tokens are tokens common to a plurality of documents, and included in a common dictionary. The common dictionary provides a mapping of code words to common tokens. A document associated dictionary is created from non-common tokens of the document to be compressed. The document associated dictionary provides another mapping of other code words to the non-common tokens. A compressed document is created. The creating of the compressed document includes replacing one or more non-common tokens of the partially compressed document with one or more other code words of the document associated dictionary. The compressed document includes the one or more code words of the partially compressed document and the one or more other code words of the document associated dictionary.

18 Claims, 10 Drawing Sheets

(56) References Cited

U.S. PATENT DOCUMENTS

| | | |
|---|---|---|
| 5,442,350 A | 8/1995 | Iyer et al. |
| 5,951,623 A | 9/1999 | Reynar et al. |
| 5,953,503 A | 9/1999 | Mitzenmacher et al. |
| 6,247,015 B1 | 6/2001 | Baumgartner et al. |
| 6,345,245 B1* | 2/2002 | Sugiyama ............. G06F 40/242 704/10 |
| 7,283,072 B1 | 10/2007 | Plachta et al. |
| 9,413,386 B1* | 8/2016 | Senior ................. H03M 7/3086 |
| 9,519,801 B2 | 12/2016 | Wilding |
| 2007/0045572 A1* | 3/2007 | Kessels .............. G03F 7/70291 250/492.22 |
| 2010/0281079 A1* | 11/2010 | Marwah ................. H03M 7/30 707/812 |
| 2010/0287460 A1* | 11/2010 | Denoual ............... G06F 40/149 715/234 |
| 2012/0310890 A1 | 12/2012 | Dodd et al. |
| 2013/0054543 A1 | 2/2013 | Brown |
| 2014/0149605 A1 | 5/2014 | Annamalaisami et al. |
| 2015/0255057 A1* | 9/2015 | Levy ................... G10H 1/0033 704/260 |
| 2016/0070699 A1 | 3/2016 | Depalov et al. |
| 2017/0288694 A1* | 10/2017 | Kataoka .............. H03M 7/6064 |

OTHER PUBLICATIONS

Chakraborty, Sanjay et al., "An Advanced Dictionary Based Lossless Compression Technique for English Text Data," CiiT International Journal of Biometrics and Bioinformatics, Mar. 2015, pp. 1-12.

Iyer, Balakrishna et al., "Data Compression Support in Databases," Proceedings of the 20$^{th}$ VLDB Conference, 1994 (no further date information available), pp. 695-704.

Khancome, Chouvalit, "Efficient Text Compression Algorithm Based on an Existing Dictionary," International Journal of Computer, 2014 (no further date information available), pp. 29-41.

Kida, Takuya et al., "Shift-And Approach to Pattern Matching in LZW Compressed Text," CPM'99, LNCS 1645, Jul. 1999, pp. 1-13.

Ziv, Jacob et al., "Compression of Individual Sequences Via Variable-Rate Coding," IEEE Transactions of Information Theory, vol. IT-24, No. 5, Sep. 1978, pp. 530-536.

* cited by examiner

COMPRESSING A PLURALITY OF DOCUMENTS

BACKGROUND

One or more aspects relate to compressing a plurality of documents. Many documents stored in the Internet (e.g., in a cloud) are text/natural language based. These documents are highly redundant since they all employ more or less the same sets of words of natural languages (e.g., one set for each language). These sets of words are—in terms of size needed to represent/store these sets of words digitally—very small as compared to the total storage space occupied by the respective documents.

Storing the documents consumes valuable disk space. Transmitting the documents to the end users consumes valuable bandwidth. Reducing the size of text documents to be stored, e.g., in the Internet, e.g. in a so-called cloud, in order to save disk space or bandwidth therefore generally seems to be desirable. One class of known compression methods uses dictionaries. A dictionary can be tailored (or customized) to data to be compressed in order to improve a compression ratio. Known processes, like DB2 or DFSMS (Data Facility Storage Management Subsystem), scan a subset of the data to compute a dictionary or "generic" or "standard" dictionary (often working well, but not optimal). A dictionary may be selected from a number of existing dictionaries or compression may start with a pre-filled dictionary.

These or other known document compression methods may work in a way that a dictionary is generated from a first original document D. That dictionary is used to compress that first original document. In a cloud environment, those tuples D* of a compressed document plus its dictionary are always stored together, for each single original document D, as they were stored in a non-cloud environment before.

SUMMARY

Shortcomings of the prior art are overcome and additional advantages are provided through the provision of a computer-implemented method of compressing documents. The method includes, for instance, obtaining a partially compressed document. The partially compressed document includes one or more code words that replace one or more common tokens of a document to be compressed. The one or more common tokens being tokens common to a plurality of documents, and included in a common dictionary. The common dictionary provides a mapping of code words to common tokens. A document associated dictionary is created from non-common tokens of the document to be compressed. The document associated dictionary provides another mapping of other code words to the non-common tokens. A compressed document is created. The creating the compressed document includes replacing one or more non-common tokens of the partially compressed document with one or more other code words of the document associated dictionary. The compressed document includes the one or more code words of the partially compressed document and the one or more other code words of the document associated dictionary.

Computer program products and systems relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE DRAWINGS

A more complete understanding of aspects of the present invention may be obtained by reference to the following Detailed Description, when taken in conjunction with the accompanying drawings, in which.

DETAILED DESCRIPTION

Figure 1A:
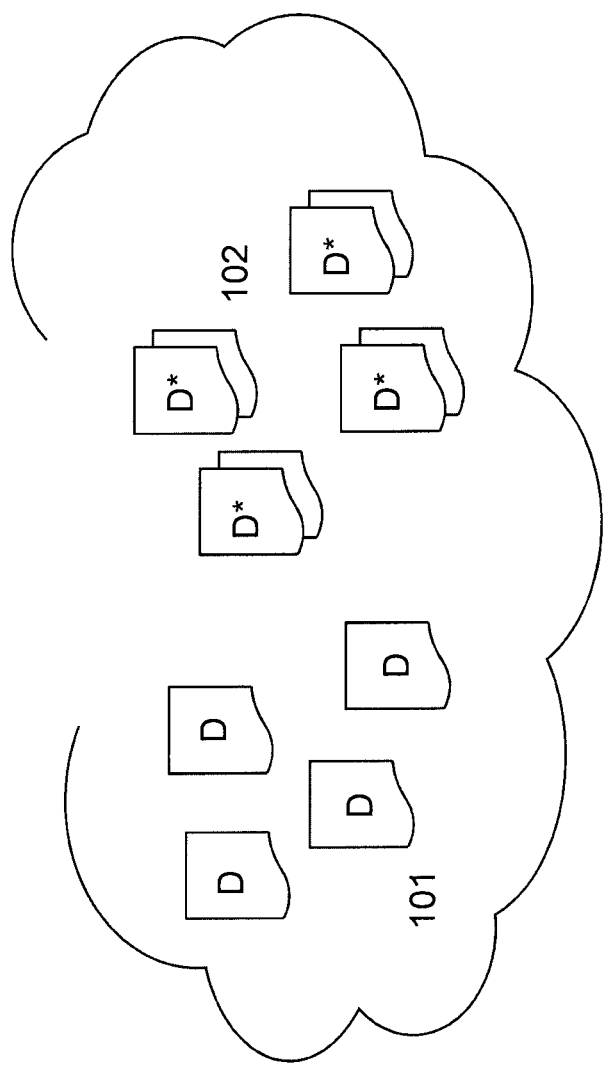
FIG. 1A shows an example of a plurality of documents, compressed in a conventional way, each with an individual local attached compression dictionary.

Embodiments of the invention will now be described more fully with reference to the accompanying drawings. Aspects of the invention may, however, be embodied in many different forms and should not be construed as limited to the embodiments set forth herein.

In the context of the description, various terms are used with the following meaning:

The term compressing denotes a process of encoding information using fewer bits than the original representation. Compression can be either lossy (i.e., irrelevance reduction) or lossless (i.e., redundancy reduction). Lossless compression reduces bits by identifying and eliminating statistical redundancy. No information is lost in lossless compression. Lossy compression reduces bits by removing unnecessary or less important (irrelevant) information. The process of reducing the size of a data file is referred to as data compression.

The term document refers to a digital document, i.e. a document in which information is represented in digital, e.g. binary, form. Examples of (digital) documents are text files, digital images, and digital sound or video sequences. Text files may be regarded as sequences of symbols or tokens, taken from a set of such symbols or tokens, e.g. a set of alphabetic characters (e.g., letters), digits or numbers.

The term token refers to any kind of symbol taken from a set of such symbols or to a sequence of such symbols, e.g. sequences of characters or digits, syllables, words, sentences or phrases, paragraphs or chapters. Different documents may be generated using different sets of tokens or by using a common set of tokens and may therefore comprise different tokens or tokens taken from the same set of tokens. Such documents, when comprising tokens taken from the same set of tokens, differ from each other in the special sequence of tokens taken from the same set of tokens.

The term "common subset of said tokens" refers to a set of tokens which a set of documents have in common, i.e. which set of tokens is used or has been used to generate some or all members of this set of documents. Such a set of tokens may comprise any kind of symbols or sequence of such symbols, e.g. sequences of characters or digits, syllables, words, sentences or phrases, paragraphs or chapters which are used or have been used to generate some or all members of this set of documents.

The term "non-common tokens" refers to a set of tokens which appear in one document but not in some or all other documents of a set of documents. If, e.g., two documents differ in comprising a certain symbol or sequence of symbols, this symbol or sequence of symbols constitute an example of a non-common token or a set of non-common tokens.

The term dictionary refers to a data structure used in dictionary encoding; a class of lossless data compression algorithms which operate by searching for matches between the text to be compressed and a set of strings contained in a data structure (called the 'dictionary') maintained by the encoder. When the encoder finds such a match, it substitutes a reference to the string's position in the data structure. A compressed document comprises codes or a sequence of codes taken from a dictionary.

The term "common dictionary" refers to a dictionary comprising common tokens of a plurality of documents, compressed or to be compressed. Tokens are common to a plurality of documents if at least some of these documents comprise these tokens. A common dictionary is used to compress a plurality of different documents. A common dictionary may also be referred to herein as a global merged dictionary (GMD).

A document associated dictionary is used to compress a document to which this dictionary is associated. A document associated dictionary is sometimes also referred to as a document specific dictionary, a document based dictionary (DBD), or as a local dictionary in the context of this disclosure.

A dictionary or a plurality of dictionaries can be made available by giving a user or a process who wants to use these dictionaries access to these dictionaries. This may, e.g., be done by downloading such a dictionary or such dictionaries from a remote or central storage system to a client system of a user. Common dictionaries may be stored in a central place to facilitate access to these common dictionaries by a plurality of users, using or intending to use these common dictionaries, e.g., for decompression of documents that have been compressed using some of these common dictionaries.

A download of a dictionary by a user may be significantly facilitated by a pointer stored in or together with a compressed document, which has been compressed using this dictionary. Such a pointer may assume, e.g., the form of a link, e.g. a uniform resource locator (URL).

For decompression of a compressed document, this document may be split into codes and the tokens corresponding to the codes may be retrieved from the dictionary or from the dictionaries.

According to one or more embodiments of the present invention, a document (D) to be compressed may be compressed with a common dictionary or a global dictionary (D+) in a first step, and subsequently with a local dictionary or document associated dictionary or document specific dictionary (D++).

According to one or more embodiments of the present invention, multiple (e.g., two) kinds of dictionaries, a common or global dictionary and a local or document associated or document specific dictionary may be combined to compress a document (D) in a single pass (D+).

According to one or more embodiments of the present invention, the common dictionary may be stored in a central place.

According to one or more embodiments of the present invention, the compressed document may contain a pointer to the common dictionary which may be used to retrieve the tokens when decompressing the document.

According to one or more embodiments of the present invention, for decompressing a document, the tokens corresponding to the codes may be requested and retrieved from a dictionary or a dictionary server using a link or links associated with the dictionary or the dictionaries.

According to one or more embodiments of the present invention, the link or links associated with the dictionary or the dictionaries may be stored in the compressed document.

According to one or more embodiments of the present invention, a common dictionary, stored, e.g., on a dictionary server, may be downloaded from the dictionary server before requesting and retrieving tokens from this dictionary.

According to one or more embodiments of the present invention, a plurality of token retrieval requests may be bundled in order to avoid many requests for many small tokens, thus saving bandwidth for transmitting the tokens.

Embodiments of the invention pertain to static dictionary compression. In comparison to variable dictionary compression, a document (D) compressed (D+) utilizing a static dictionary is easily searchable using defined dictionary bit patterns. According to one or more embodiments of the present invention, a global or common dictionary may be used in combination with one or more frequently smaller local or document specific dictionaries.

According to one or more embodiments of the present invention, a method for compressing a plurality of documents may involve one or more of the following steps: splitting each document into tokens; storing a common subset of the tokens in a central or common dictionary, in which the central or common dictionary provides a binary encoding which defines a mapping from codes to tokens; creating a document associated dictionary from the non-common tokens for each document which also provides a binary encoding which defines a mapping from codes to tokens; and creating a compressed document which includes code words of the binary encoding of the common dictionary and of the document associated dictionary, in which the compressed document contains a pointer to the central or common dictionary which is used to retrieve the tokens when decompressing the document.

According to one or more embodiments of the present invention, if a user requests a document, the compressed document may be supplied without the dictionary. When reading the document, reader software, e.g., running on a client system of the user, may automatically download the relevant parts of the dictionary from a dictionary server. The reader software may cache the downloaded dictionary parts in order to avoid multiple downloads of the same dictionary parts.

With embodiments of the present invention, the compressed documents are typically small since the dictionary may be kept separate from the documents. Therefore, less disk space may be used for storing compressed documents, e.g., on a server in a cloud. Transmission of documents may therefore be faster or bandwidth requirements may be relaxed when transmitting the documents, e.g., to a user.

A common dictionary may be used for thousands of documents and dictionary downloads may occur relatively seldom, if a dictionary is cached at the user side, e.g., on a user client. Common dictionaries may be standardized and shared between thousands of web sites, serving to reduce the size of millions of documents.

According to embodiments of the invention, text documents may be split into tokens. The tokens may be stored in a dictionary (e.g., each token only once even if it occurs many times).

Dictionaries employ, e.g., a binary encoding which defines a mapping from codes to the tokens. The compressed documents include a code word or a plurality of code words of the binary encoding.

According to embodiments of the invention, a compressed document may contain a pointer, e.g., a URL linking, to an address of the dictionary which is used to decompress the document. This pointer may be used to retrieve the tokens when decompressing the document.

Dictionaries may be stored on dictionary servers. These may be the same servers as the servers on which the documents are stored. Alternatively, the servers may be different from the document servers, which may be located anywhere, e.g., in a cloud. A reader software may split a compressed document into the codes which were generated during compression and which serve as an index into the dictionary. The reader software may request the tokens corresponding to the codes from the dictionary server using the dictionary URL, which may be stored in the compressed document. A request for a specific token may include a pointer, e.g. a URL, and the code for the token. In some embodiments of the invention, token retrieval requests may be bundled in order to avoid many requests for many small tokens, thus, saving bandwidth for transmitting the tokens.

Further embodiments of the present invention provide a method to decompress a compressed document by making available the dictionary or dictionaries that has or have been involved in compressing the document, splitting the compressed document to be decompressed into codes which were generated during compression and which serve as index into the dictionary or the dictionaries and requesting and retrieving tokens corresponding to the codes from the dictionary.

As shown in FIG. 1A, according to prior art, uncompressed documents D 101 are compressed separately or independently, i.e. compressed documents D* 102 are derived from uncompressed documents D with one or more individual, document specific, local and preferably attached compression dictionary or dictionaries.

Figure 1B:
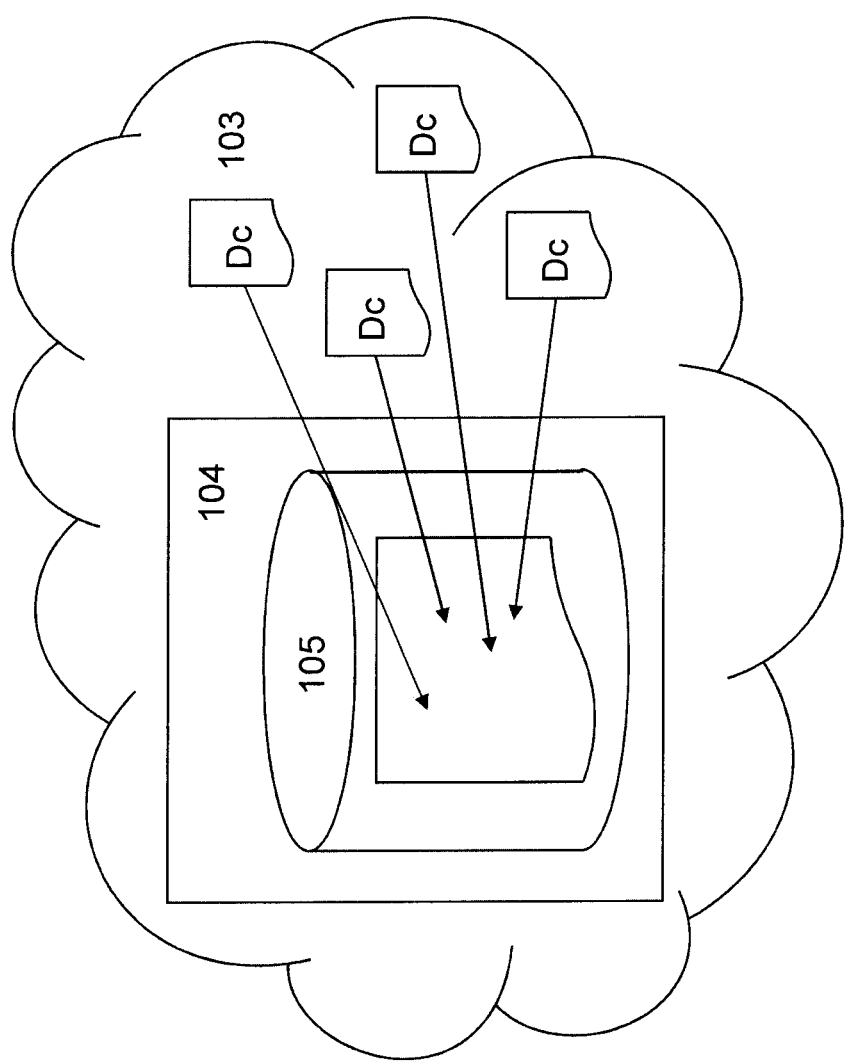
FIG. 1B shows one example of a diagrammatic illustration of a plurality of compressed documents with compression information linked in a global merged dictionary and in a document-based dictionary.
Figure 9:
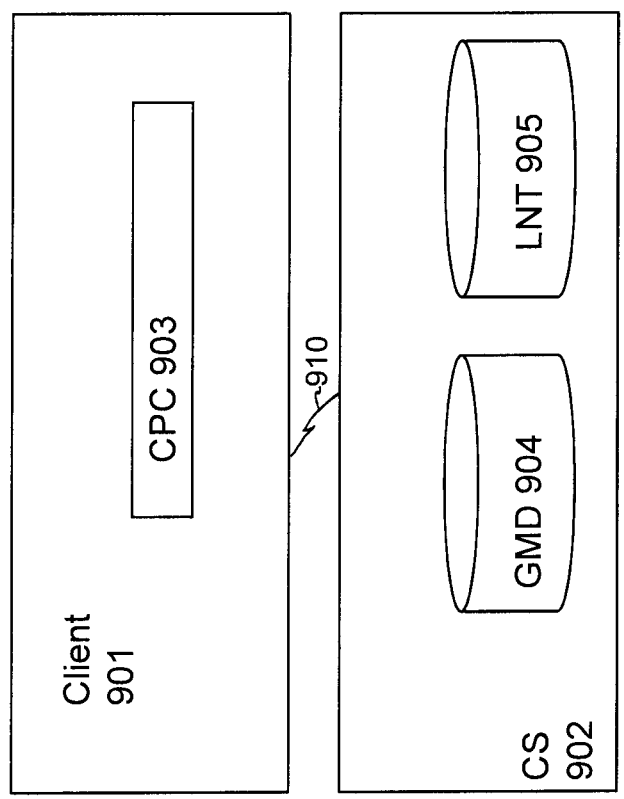
FIG. 9 shows one example of the components of a data processing system according to an embodiment of the present invention.

As shown in FIG. 1B, according to embodiments of the invention, compressed documents Dc 103 may be derived from uncompressed documents D with compression information linked in a global merged dictionary GMD. Embodiments of the present invention may leverage cloud advantages by introducing a global merged dictionary (GMD) 105 on a central server (CS) 104 as also shown in FIG. 9. For instance, GMD 904 on a CS 902 may reduce redundancies from the single dictionaries by combining those and by making GMD 904 available for a larger number of single documents 103 (FIG. 1B).

Figure 2:
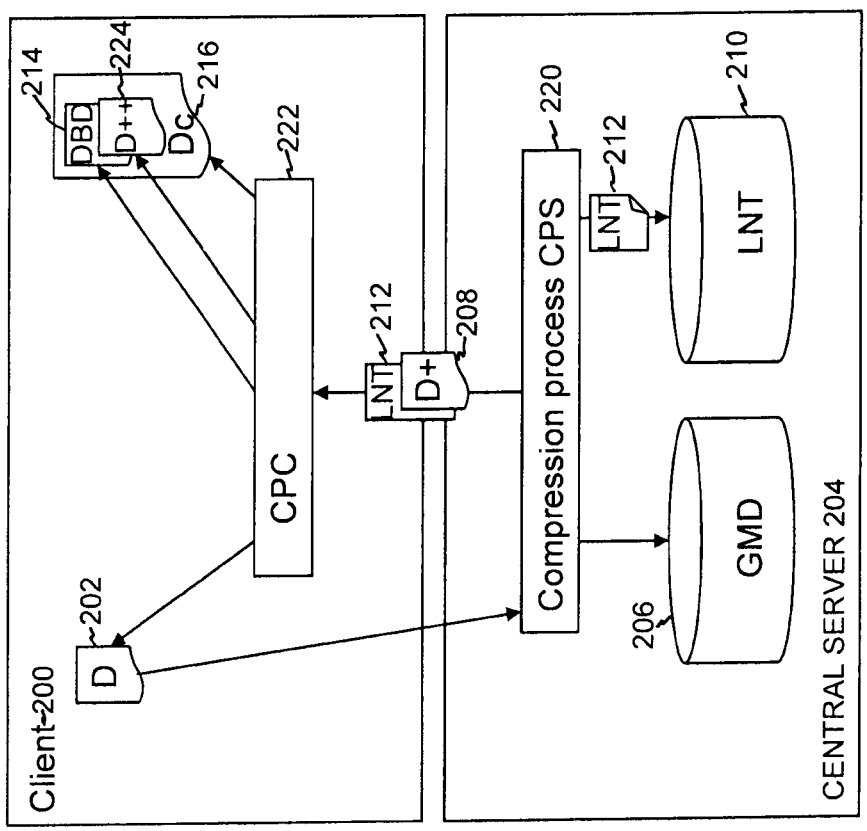
FIG. 2 shows one example of a diagrammatic illustration of a compression system according to an embodiment of the present invention.

As shown in FIG. 2, a client 200 may send an uncompressed document D 202 to a server 204. The server may receive the uncompressed document D. Dictionary tokens in D may be identified. Matching tokens may be replaced in document D with links to a GMD 206 (e.g., replace tokens with code words or codes of the GMD) to become D+ 208 (save GMD version in D+, see FIG. 5). Non-matching tokens 212 may be added to a list (LNT) 210 of non-matching (i.e., not matching) tokens. Non-matching tokens 212 may be sent to the client. GMD-compressed document D+ 208 may be sent to the client for further compressing.

The client then may receive non-matching tokens 212 and GMD-compressed document D+ 208, build a document based dictionary DBD 214 from the non-matching tokens and replace the non-matching tokens in document D+ with links to the document-based dictionary DBD. The client may then output a fully compressed document Dc 216 and may remove the uncompressed document D. Acronyms used herein include: GMD: Global merged dictionary, DBD: Document-based dictionary, LNT: List of non-matching tokens, KNT: Known non-matching tokens.

FIG. 9 visualizes embodiments of a compression system according to embodiments of the invention, which may include a number of clients 901 connected to CS 902 over a network 910. On client 901, document D is stored as described with reference to FIG. 2 and shall be compressed by aspects of the technique described herein. Referring to FIGS. 2 and 9, the client sends document D over the network to a compression process CPS 220 of CS 204, 902. CPS 220 receives D 202 and identifies tokens already stored in GMD 206, 904. Matching tokens in the GMD are replaced with links in D, and non-matching tokens, if they exist, are stored in a list of non-matching tokens (LNT) 210, 905, and are sent to the compression process of the client CPC 222, 903 along with the GMD-compressed document D+ 208. On the client side, the CPC receives non-matching tokens and the GMD-compressed document D+, if it exists, builds a document-based dictionary (DBD) from non-matching tokens, replaces non-matching tokens in D+ with links to DBD to generate a new document D++ 224. CPC outputs a document Dc 216 and finally removes the original and uncompressed document D 202.

Figure 3:
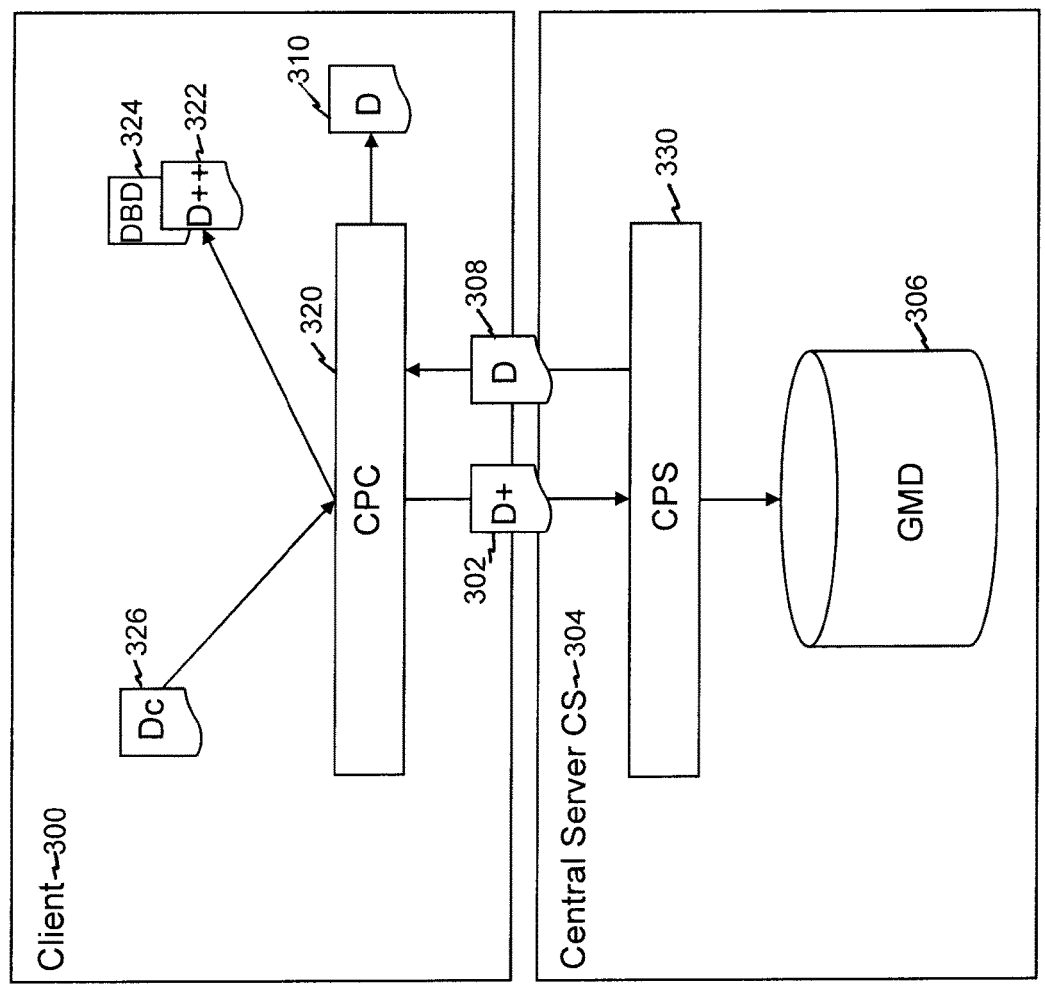
FIG. 3 shows one example of a diagrammatic illustration of a decompression system according to an embodiment of the present invention.

As shown in FIG. 3, a client 300 may send a GMD-compressed document D+ 302 to a server 304. The server receives compressed document D+ 302, replaces links in document D+ with tokens in a GMD 306 (use saved GMD version, see FIG. 6 and FIG. 7) and sends a GMD-decompressed, thus fully decompressed document D 308, to client 300 where the client outputs the fully decompressed document D 310, and removes the GMD-compressed document D+ 302.

As described herein, FIG. 3 shows an embodiment for decompression according to the compression embodiment depicted in FIG. 2. On client 300, compression process CPC 320 extracts D++ 322/DBD 324 from Dc 326 and removes Dc 326. D++ 322 may be decompressed by replacing links with tokens from DBD 324 to build D+ 302. D+ 302 may be sent to CS 304, where CPS 330 receives D+ 302. CPS 330 may replace links in D+ 302 with tokens stored in GMD 306. CPS 330 sends GMD-decompressed, thus fully decompressed document D 308, to CPC 320. CPC 320 receives and outputs fully decompressed document D 310, and removes D++ 322 with its DBD 324.

Figure 4:
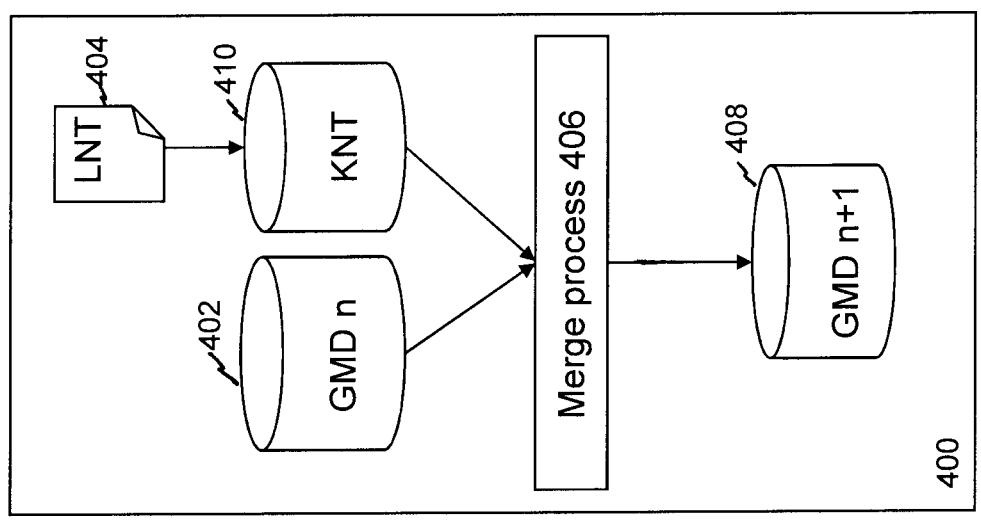
FIG. 4 shows one example of a diagrammatic illustration of an iterative improvement of a global merged dictionary according to an embodiment of the present invention.

As shown in FIG. 4, at the server 400, the following steps may be executed, in one example:

1. Add tokens not in GMD n 402 (i.e., GMD in state or version n) to LNT 404 until a defined threshold is reached.

2. Create next version GMD n+1 408 of GMD from preceding version GMD n 402 by merging 406 LNT 404 with GMD n 402.

3. Keep GMD n 402 as long as any of the clients use this version of GMD.

4. Empty LNT 404.

5. Add tokens not in GMD n+1 408 to LNT 404 until a defined threshold is reached.

In one example, FIG. 4 shows as an embodiment of the invention, an optional extension to some previously described embodiments, characterized by the introduction of GMD versioning, implemented by an iterative GMD improvement process. This process may enrich the contents of GMD n 402 by adding tokens in a merge process 406, which typically results in a higher matching rate for the subsequent compression requests. This merge process outputs a new GMD n+1 408 version as follows: In a first step, LNT 404 is merged with KNT 410. In a further step, GMD version n 402 is merged with KNT 410 when a GMD-merge-threshold is reached. The merge process 406 outputs a next version GMD n+1 408 and clears the content of KNT 410. In a further step, GMD n 402 may be removed, when no more clients exist as users of GMD n 402. This process executes (is repeated) iteratively.

Figure 5:
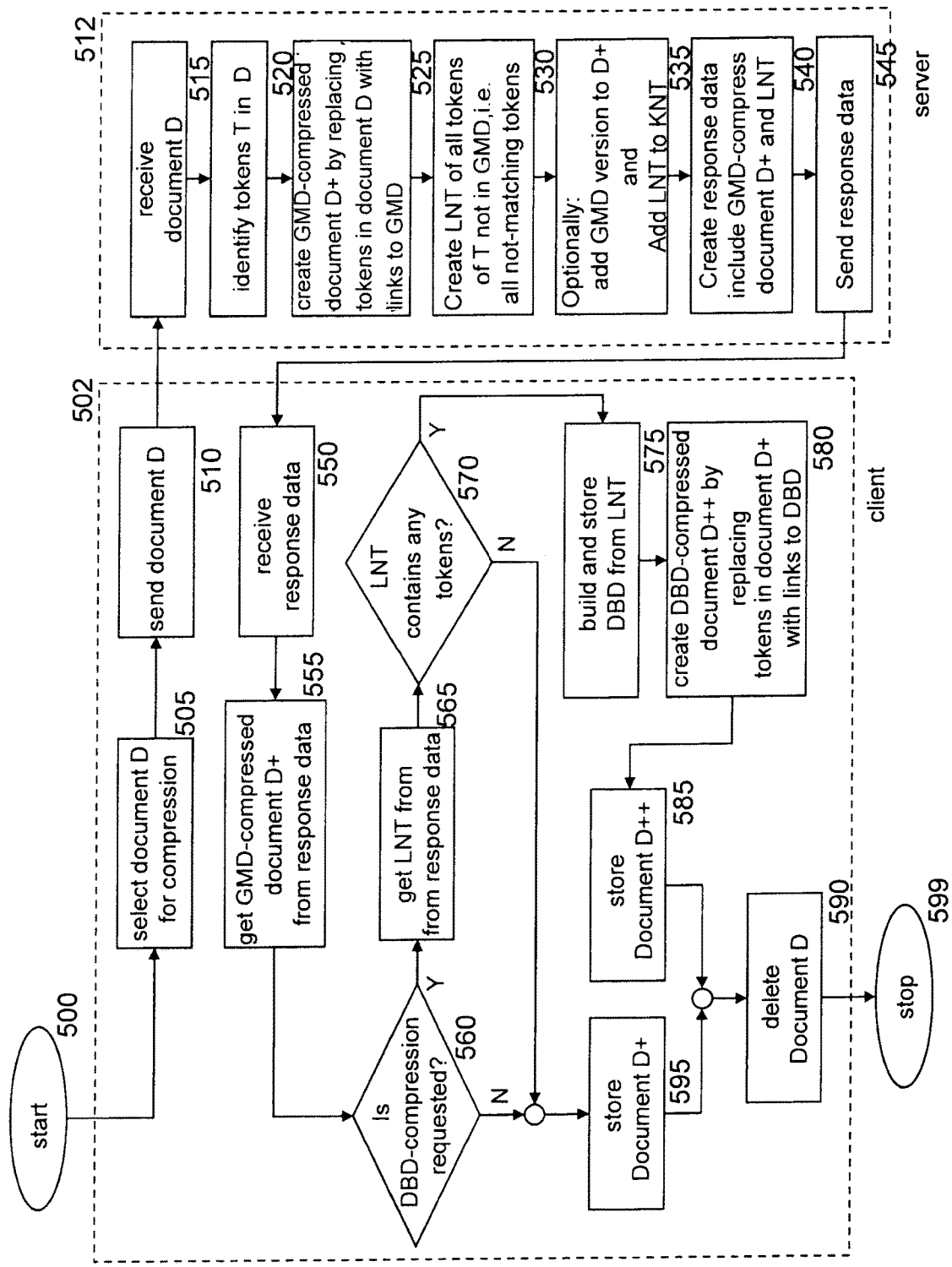
FIG. 5 shows one example of a flow chart of a compression process according to an embodiment of the present invention.

As shown in FIG. 5, in one example, a flow diagram of an embodiment of the invention starts with 500 and selecting a document D for compression 505 on client 502. It sends document D 510 to a server 512. Server 512 receives document D 515 and identifies the tokens T in document D 520. In a next step 525, the server 512 creates a GMD-compressed document D+ by replacing tokens in document D with links to GMD. In step 530, list LNT of tokens T, which are not in GMD, is created. Consequently, LNT contains all non-matching tokens from T in GMD. The following step 535 may be skipped unless GMD is versioned, i.e. several versions of GMD are built in a sequence of an iterative process. If GMD is versioned, then in step 535, the used GMD version is added to document D+ and LNT is added to KNT. The next step 540 creates the response data, which includes document D+ and LNT. In the following step 545, server 512 sends the response data to client 502. Client 502 receives the response data 550. In step 555, client 502 gets the GMD-compressed document D+. In step 560, client 502 checks if DBD-compression is requested. If a DBD-compression is not requested, it continues with step 595 storing document D+ and step 590 deleting document D. Otherwise, client 502 gets the LNT from the response data 565. In the next step 570, it checks if LNT contains any tokens. If LNT does not contain any tokens, client 502 continues with step 595. Otherwise, it builds and stores DBD from LNT 575. In following step 580, client 502 creates a DBD-compressed document D++ by replacing tokens in the document D+ with links to the DBD, and stores document D++ 585. Next, it deletes document D 590 and stops 599.

Figure 6:
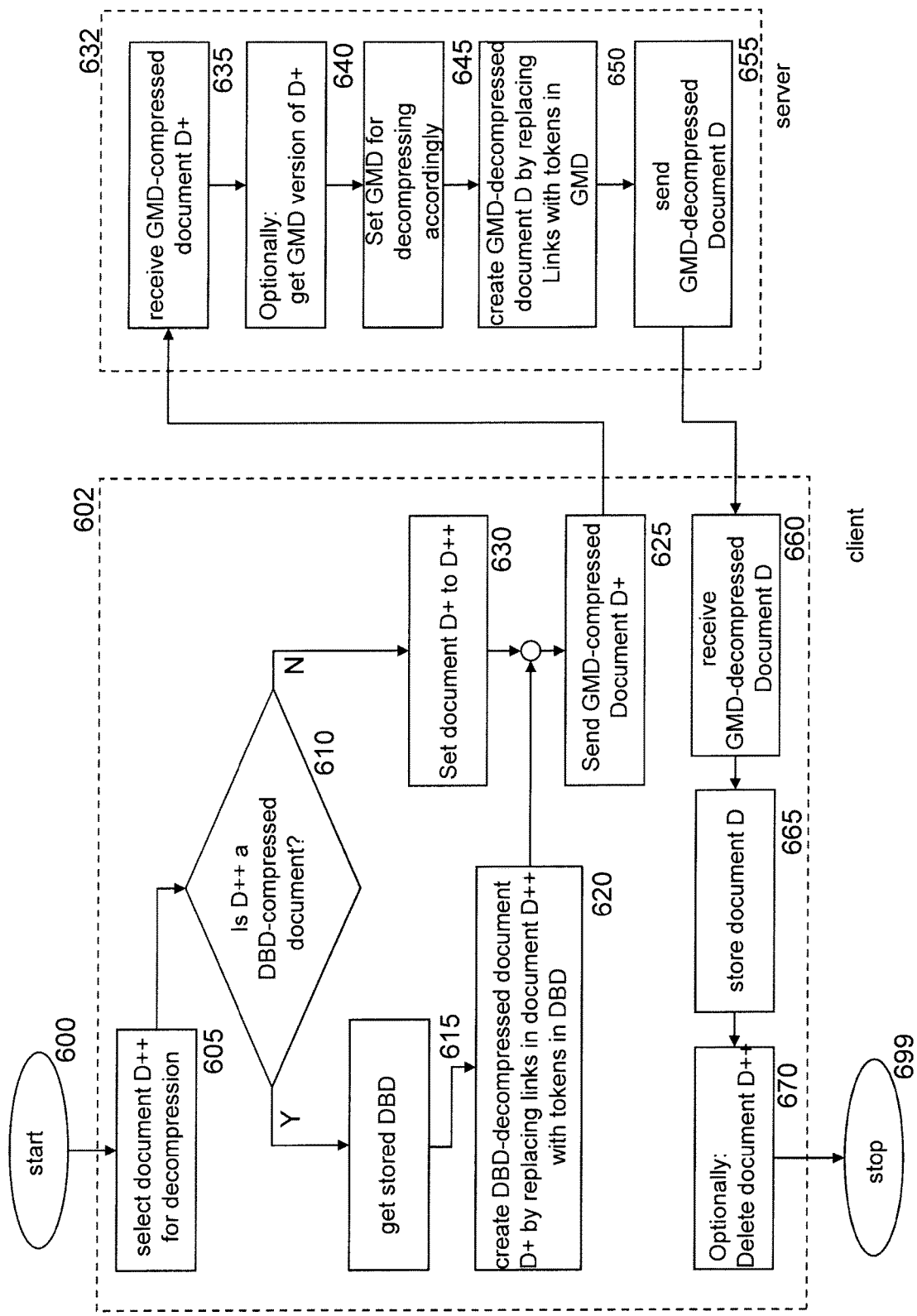
FIG. 6 shows one example of a flow chart of a decompression process according to an embodiment of the present invention.

The example flow diagram shown in FIG. 6 starts 600 by selecting a document D++ for decompression 605 on client 602. In the next step 610, it may be checked if document D++ is a DBD-compressed document. If D++ is not a DBD-compressed document, client 602 sets document D+ to document D++ 630. Otherwise, it gets the stored DBD 615 and creates a DBD-decompressed document D+ by replacing links in document D++ with tokens in the DBD 620. In step 625, client 602 sends document D+, which is a GMD-compressed document, to server 632. Server 632 receives the GMD-compressed document D+ 635.

The following step 640 may be skipped unless GMD is versioned. If GMD is versioned, then the process gets the GMD version from document D+. In the following step 645, server 632 sets GMD to the current GMD unless a GMD version is read in step 640, then it sets GMD to the version. Server 632 creates a GMD-decompressed document D by replacing links with tokens in the GMD 650. Next, in step 655, it sends the GMD-decompressed document D to client 602. Client 602 receives the GMD-decompressed D 660 and stores the document D 665. In the next step 670, it optionally deletes the document D++ and stops in step 699.

Figure 7:
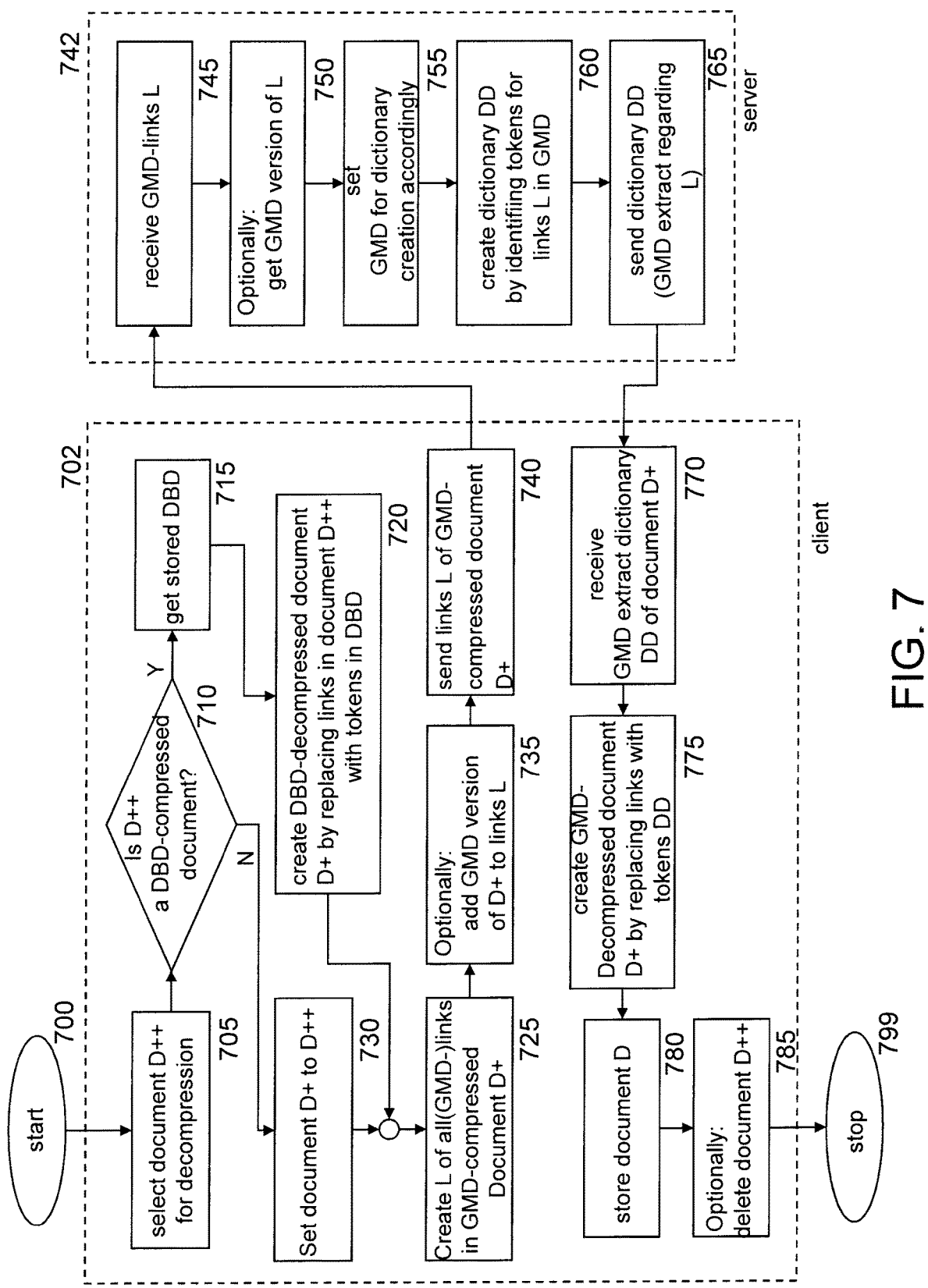
FIG. 7 shows one example of a flow chart of a decompression process at the client side according to an embodiment of the present invention.

The example flow diagram shown in FIG. 7 starts 700 by selecting a document D++ for decompression 705 on client 702. In the next step 710, the process checks if document D++ is a DBD-compressed document. If D++ is not a DBD-compressed document, client 702 sets document D+ to document D++ 730. Otherwise, it gets the stored DBD 715 and creates a DBD-decompressed document D+ by replacing links in document D++ with tokens in the DBD 720. In step 725, client 702 creates a set L with the links in document D+, i.e. all links in L are GMD-links and D+ is GMD-compressed. The following step 735 may be skipped unless GMD is versioned. If GMD is versioned, then it gets the GMD version from document D+ and adds the version to links L. In step 740, client 702 sends links L of GMD-compressed document D+ to server 742. Server 742 receives GMD-links 745.

The following step 750 may be skipped unless GMD is versioned. If GMD is versioned, then it gets the GMD version from the links L. In the following step 755, server 742 sets GMD to the current GMD unless a GMD version is read in step 750, then it sets the GMD to the version. Server 742 creates a dictionary DD by identifying tokens for links L in GMD 760, e.g. creates a subset of the GMD regarding the links L. Next, it sends 765 the dictionary DD to client 702. Client 702 receives the dictionary DD 770. It creates a GMD-decompressed document D by replacing links with tokens in DD 775 and stores document D 780. In the next step 785, client 702 optionally deletes document D++ and stops 799.

Figure 8:
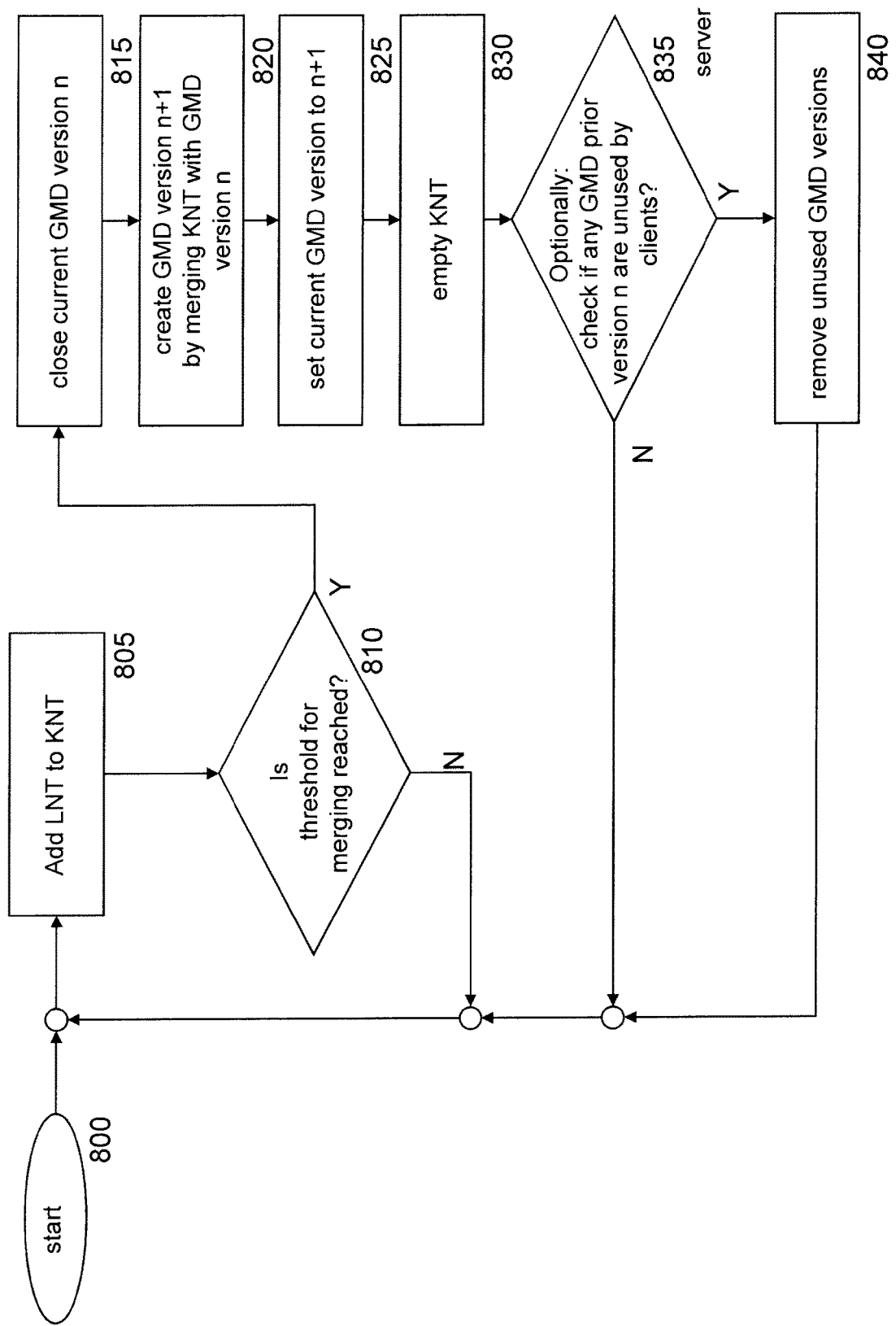
FIG. 8 shows one example of a flow chart of an improvement of a global merged dictionary according to an embodiment of the present invention.

The example flow diagram shown in FIG. 8 starts 800 by adding LNT to KNT 805. Next step 810 checks if a threshold for merging KNT with GMD is reached, e.g. number of elements in KNT exceeds a defined number or a defined time interval is expired. If the threshold is not reached, it continues with 805. Otherwise, it closes current GMD version "n" 815. Step 820 creates a new version "n+1" of GMD by merging KNT with GMD version "n", and sets current GMD version to "n+1" 825. Following step 830 empties the KNT. The following step 835 is optional and is skipped (by continuing with 805) unless GMD is versioned. If GMD is versioned, step 835 checks if any GMD prior version "n" are unused by clients, e.g. using a counter for every GMD version, which is incremented when used for compression and decremented by used for decompression. If an unused GMD version exists, then step 840 removes the versions and continues with step 805. Otherwise, the process continues with step 805.

The above mentioned and/or further embodiments of aspects of the invention may include, for instance:

Store the DBD on a server instead of a client and further save bandwidth by not employing duplication on DBDs (i.e., avoid sending complete documents to the server);

During compression: Send only tokens or token bulks and cache received codes;

During decompression: Send only code or code bulks and cache received tokens;

Optimize new GMD version;
  Employ token use counters on GMD and LNT;
    On creation of new GMD version: only (in one example) consider tokens whose use counter exceeds a threshold.

Further embodiments may, e.g., be characterized by features including, for instance:
  Client without DBD;
  Central server with or without KNT;
  Central server with or without GMD versioning;
  Client-side compression: instead of sending the whole document D to the central server, only the tokens out of D are sent and the corresponding GMD-links and LNT are received from the central server. (Note: this is analogous to the Client-side decompression as depicted in FIG. 7.)

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method of compressing documents, said computer-implemented method comprising:
    sending a document to be compressed from a local device to a central system for partial compressing using a common dictionary providing a global mapping of code words to common tokens for a plurality of documents to be compressed;
    based on the sending, receiving at the local device from the central system a partially compressed document and a list of non-matching tokens, the partially compressed document including one or more code words that replace one or more common tokens of the document to be compressed, the one or more common tokens being tokens common to the plurality of documents, the list of non-matching tokens identifying non-common tokens in the document to be locally compressed not matching any common tokens in the common dictionary;
    based on the receiving, creating at the local device a document associated dictionary from non-common tokens in the received list of non-matching tokens of the document to be compressed, the document associated dictionary providing another mapping of other code words to the non-common tokens; and
    creating a compressed document at the local device, the creating the compressed document including replacing one or more non-common tokens of the partially compressed document received from the central system with one or more other code words of the document associated dictionary, wherein the compressed document includes the one or more code words of the partially compressed document and the one or more other code words of the document associated dictionary.

2. The computer-implemented method according to claim 1, further comprising:
    identifying within the plurality of documents a plurality of tokens; and
    storing a common subset of the plurality of tokens in the common dictionary, the common dictionary providing a binary encoding defining the mapping of the code words to the common tokens.

3. The computer-implemented method according to claim 1, wherein the common dictionary is stored in the central system.

4. The computer-implemented method according to claim 1, wherein the compressed document includes a pointer to the common dictionary to be used to retrieve the one or more common tokens to decompress the compressed document.

5. The computer-implemented method according to claim 1, further comprising decompressing the compressed document.

6. The computer-implemented method according to claim 5, wherein the decompressing comprises using the common dictionary to replace the one or more code words in the compressed document with the one or more common tokens corresponding thereto.

7. The computer-implemented method according to claim 6, further comprising downloading the common dictionary from a dictionary server prior to using the common dictionary to decompress the compressed document.

8. The computer-implemented method of claim 6, wherein the decompressing further comprises:
    obtaining the document associated dictionary; and
    using the document associated dictionary to replace the one or more other code words in the compressed document with the one or more non-common tokens corresponding thereto.

9. A computer system for compressing documents, said computer system comprising:
    a memory; and
    a processor in communication with the memory, wherein the computer system is configured to perform a method, said method comprising:
        sending a document to be compressed from a local device to a central system for partial compressing using a common dictionary providing a global mapping of code words to common tokens for a plurality of documents to be compressed;
        based on the sending, receiving at the local device from the central system a partially compressed document and a list of non-matching tokens, the partially compressed document including one or more code words that replace one or more common tokens of the document to be compressed, the one or more common tokens being tokens common to the plurality of documents, the list of non-matching tokens identifying non-common tokens in the document to be locally compressed not matching any common tokens in the common dictionary;
        based on the receiving, creating at the local device a document associated dictionary from non-common tokens in the received list of non-matching tokens of the document to be compressed, the document associated dictionary providing another mapping of other code words to the non-common tokens; and creating a compressed document at the local device, the creating the compressed document including replacing one or more non-common tokens of the partially compressed document received from the central system with one or more other code words of the document associated dictionary, wherein the compressed document includes the one or more code words of the partially compressed document and the one or more other code words of the document associated dictionary.

10. The computer system according to claim 9, wherein the method further comprises:
identifying within the plurality of documents a plurality of tokens; and
storing a common subset of the plurality of tokens in the common dictionary, the common dictionary providing a binary encoding defining the mapping of the code words to the common tokens.

11. The computer system according to claim 9, wherein the method further comprises decompressing the compressed document.

12. The computer system according to claim 11, wherein the decompressing comprises using the common dictionary to replace the one or more code words in the compressed document with the one or more common tokens corresponding thereto.

13. The computer system of claim 12, wherein the decompressing further comprises:
obtaining the document associated dictionary; and
using the document associated dictionary to replace the one or more other code words in the compressed document with the one or more non-common tokens corresponding thereto.

14. A computer program product for compressing documents, said computer program product comprising:
a computer readable storage medium readable by a processing circuit and storing instructions for performing a method comprising:
sending a document to be compressed from a local device to a central system for partial compressing using a common dictionary providing a global mapping of code words to common tokens for a plurality of documents to be compressed;
based on the sending, receiving at the local device from the central system a partially compressed document and a list of non-matching tokens, the partially compressed document including one or more code words that replace one or more common tokens of the document to be compressed, the one or more common tokens being tokens common to the plurality of documents, the list of non-matching tokens identifying non-common tokens in the document to be locally compressed not matching any common tokens in the common dictionary;
based on the receiving, creating at the local device a document associated dictionary from non-common tokens in the received list of non-matching tokens of the document to be compressed, the document associated dictionary providing another mapping of other code words to the non-common tokens; and
creating a compressed document at the local device, the creating the compressed document including replacing one or more non-common tokens of the partially compressed document received from the central system with one or more other code words of the document associated dictionary, wherein the compressed document includes the one or more code words of the partially compressed document and the one or more other code words of the document associated dictionary.

15. The computer program product according to claim 14, wherein the method further comprises:
identifying within the plurality of documents a plurality of tokens; and
storing a common subset of the plurality of tokens in the common dictionary, the common dictionary providing a binary encoding defining the mapping of the code words to the common tokens.

16. The computer program product according to claim 14, wherein the method further comprises decompressing the compressed document.

17. The computer program product according to claim 16, wherein the decompressing comprises using the common dictionary to replace the one or more code words in the compressed document with the one or more common tokens corresponding thereto.

18. The computer program product of claim 17, wherein the decompressing further comprises:
obtaining the document associated dictionary; and
using the document associated dictionary to replace the one or more other code words in the compressed document with the one or more non-common tokens corresponding thereto.

\* \* \* \* \*